(12) United States Patent
Terada

(10) Patent No.: US 11,910,694 B2
(45) Date of Patent: Feb. 20, 2024

(54) VAPOR DEPOSITION METHOD

(71) Applicant: Japan Display Inc., Tokyo (JP)

(72) Inventor: Shigeki Terada, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 402 days.

(21) Appl. No.: 17/200,917

(22) Filed: Mar. 15, 2021

(65) Prior Publication Data

US 2021/0202854 A1 Jul. 1, 2021

Related U.S. Application Data

(63) Continuation of application No. PCT/JP2019/040411, filed on Oct. 15, 2019.

(30) Foreign Application Priority Data

Oct. 23, 2018 (JP) ................. 2018-199475

(51) Int. Cl.
| | |
|---|---|
| H10K 71/16 | (2023.01) |
| C23C 14/04 | (2006.01) |
| C23C 14/24 | (2006.01) |
| H10K 71/00 | (2023.01) |

(52) U.S. Cl.
CPC ......... *H10K 71/166* (2023.02); *C23C 14/042* (2013.01); *C23C 14/24* (2013.01); *H10K 71/00* (2023.02); *H10K 71/164* (2023.02)

(58) Field of Classification Search
CPC ...... H01K 71/166; C23C 14/042; C23C 14/24
See application file for complete search history.

(56) References Cited

U.S. PATENT DOCUMENTS

| | | | |
|---|---|---|---|
| 2017/0342541 A1 | 11/2017 | Bangert et al. | |
| 2019/0352765 A1 | 11/2019 | Ono et al. | |

FOREIGN PATENT DOCUMENTS

| | | | |
|---|---|---|---|
| JP | 2012-84544 A | 4/2012 | |
| JP | 2014-70239 A | 4/2014 | |
| JP | 2017-538864 A | 12/2017 | |
| JP | 2018-127705 A | 8/2018 | |
| TW | M294381 U | 7/2006 | |
| WO | WO-2016091303 A1 * | 6/2016 | ........... C23C 14/042 |

OTHER PUBLICATIONS

English machine translation of Office Action dated May 18, 2023, issued in CN Appl. No. 201980066751.4, 8pp.
International Search Report and Written Opinion dated Dec. 17, 2019, received for PCT Application PCT/JP2019/040411 Filed on Oct. 15, 2019, 9 pages including English Translation.
English machine translation of Office Action dated Feb. 1, 2022 issued in Japanese Patent Application No. 2018-199475, 4 pp.

(Continued)

*Primary Examiner* — Marc Anthony Armand
(74) *Attorney, Agent, or Firm* — XSENSUS LLP

(57) ABSTRACT

A vapor deposition method for depositing evaporated materials on a substrate using a mask includes arranging a mask frame and correcting a deflection of the mask frame in the direction of gravity after the mask frame is placed. The mask frame faces the substrate so that a first side is higher than a second side in a direction of gravity. The mask frame is provided with a mask and has the first side and the second side facing each other.

11 Claims, 16 Drawing Sheets

(56) References Cited

OTHER PUBLICATIONS

Office Action dated Sep. 16, 2022 in Chinese Patent Application No. 201980066751.4, 13 pages. (Submitting Computer-Generated English Translation only).
Office Action dated Sep. 28, 2023 in Chinese Patent Application No. 201980066751.4, 9 pages. (Submitting Computer-Generated English Translation only).
Office Action dated Nov. 22, 2023 in Chinese Patent Application No. 201980066751.4, 11 pages. (Submitting Computer-Generated English Translation only).

* cited by examiner

VAPOR DEPOSITION METHOD

CROSS-REFERENCE TO RELATED APPLICATIONS

The present application is a continuation application of International Patent Application No. PCT/JP2019/040411, filed Oct. 15, 2019, which claims priority to Japanese Patent Application No. 2018-199475, filed Oct. 23, 2018. The contents of these applications are incorporated herein by reference in their entirety.

FIELD

The present invention relates to a technique for depositing a vapor deposition material on a substrate.

BACKGROUND

An organic EL element included in an organic EL display device includes a light-emitting layer made of an organic EL material between an anode and a cathode. The organic EL material is, for example, a polymer material or a low molecular weight material, but at present, a low molecular weight organic EL material is often used.

A light-emitting layer using a low molecular weight organic EL material is usually formed into a substrate by a vapor deposition method. That is, a thin film is formed by applying heat to the organic EL material to evaporate it and depositing the evaporated organic EL material on a substrate. As one of such vapor deposition apparatuses, a vertical vapor deposition apparatus in which a substrate is arranged in an upright manner in the vapor deposition apparatus is known (for example, Japanese laid-open patent publication No. 2012-84544 and Japanese laid-open patent publication No. 2014-70239). According to the vertical vapor deposition apparatus, since it is possible to process a large substrate upright, it is advantageous that the occupied area of the vapor deposition apparatus can be reduced.

SUMMARY

A vapor deposition method of an embodiment of the present invention is a vapor deposition method for depositing a vapor deposition material on a substrate using a mask, the vapor deposition method includes: arranging a mask frame facing the substrate so that a first side is higher than a second side in a direction of gravity, the mask frame being provided with a mask and having the second side facing each other; and correcting a deflection of the mask frame in the direction of gravity after the mask frame is placed.

DESCRIPTION OF EMBODIMENTS

Figure 1:
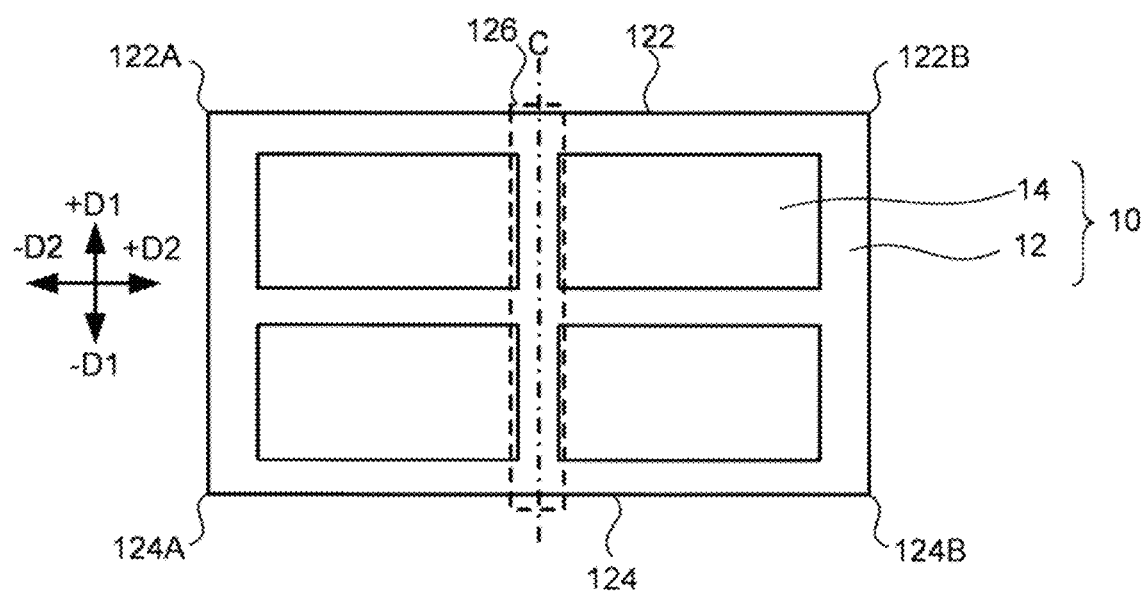
FIG. 1 is a front view of a vapor deposition mask according to the first embodiment.

When using a vertical vapor deposition apparatus, it is necessary to arrange a vapor deposition mask upright according to a substrate. In this case, as the size of the substrate increases, the size of the vapor deposition mask also increases, so that a deflection of the vapor deposition mask due to its own weight may be a problem.

It is an object of the present invention to provide a technique for suppressing a vapor deposition defect caused by a deflection of a mask.

Embodiments of the present invention will be described below with reference to the drawings. However, the present invention can be implemented in various modes without departing from the gist thereof and should not be construed as being limited to the description of the following exemplary embodiments. For the sake of clarity of description, the drawings may be schematically represented with respect to widths, thicknesses, shapes, and the like of the respective portions compared with actual embodiments but are merely an example and do not limit the interpretation of the present invention. In this specification and each drawing, elements having the same functions as those described with reference to the preceding drawings are denoted by the same reference numerals, and a repetitive description thereof may be omitted.

In this specification and in the claims, "upper" and "lower" refer to relative positional relationships relative to surfaces of the substrate on which a light-emitting element is formed (hereinafter simply referred to as the "surface"). For example, in this specification, the direction from the surface of the substrate toward the light-emitting element is referred to as "upper" and the opposite direction is referred to as "lower". In this specification and in the claims, the expression "above" simply includes both the case where another structure is arranged directly above a structure, and the case where another structure is arranged above a structure via yet another structure, unless otherwise specified.

When explaining the direction in the following description, the gravity direction is "−D1 direction" and the opposite direction of the gravity direction is "+D1 direction". One direction in the horizontal direction is "−D2 direction", the opposite direction of the −D2 direction is "+D2 direction".

First Embodiment

FIG. 1 is a front view of a vapor deposition mask 10 according to the present embodiment. The vapor deposition mask 10 is a mask for vapor deposition used in a vertical vapor deposition apparatus. A vapor deposition material for forming a light-emitting layer of an organic EL display device is an organic EL material. The vapor deposition mask 10 includes a mask frame 12 and a plurality of masks 14. The mask frame 12 is a frame body having a plurality of openings. Therefore, the mask frame 12 includes a partition for dividing the space inside the mask frame 12 into the plurality of openings. In the present embodiment, an outer edge and the plurality of openings of the mask frame 12 is rectangular when viewed from the front. Each of the plurality of openings is provided at a position facing the mask 14. Since the mask frame 12 is placed in an environment where the temperature changes relatively large through the vapor deposition process, it is preferably composed of a material having a small thermal expansion coefficient.

The vapor deposition mask 10 is arranged upright during a vapor deposition. In this case, an upper side of the mask frame 12 is a first side 122, and a lower side is a second side 124. The first side 122 and the second side 124 face each other. The first side 122 is higher than the second side 124. That is, the first side 122 exists in the +D1 direction with respect to the second side 124. In the no-deflected state, the first side 122 and the second side 124 extend in the horizontal direction. One end of the −D2 direction side of the first side 122 is a corner 122A, one end of the +D2 direction side is a corner 122B. One end of the −D2 direction side of the second side 124 is a corner 124A, one end of the +D2 direction side is a corner 124B. Among partitions of the mask frame 12, a partition that intersects the first side 122 and the second side 124 is defined as a partition 126. The axis passing through the center of the first side 122 and the center of the second side 124 is defined as an axis C. The axis C passes through the position of the partition 126. As shown in FIG. 1, in the present embodiment is a linearly symmetric figure when viewed the mask frame 12 from the front, the axis C exists at the position of the axis of symmetry of this figure.

The plurality of masks 14 are provided on the mask frame 12. The mask 14 is an electroforming mask composed of a metal film formed by electroforming. The mask 14 is fixed to the mask frame 12 by welding. Each of the masks 14 may correspond to one organic EL display device. When the mask 14 is used for manufacturing a small organic EL display device, the mask 14 may correspond to a plurality of organic EL display devices. Although not shown in FIG. 1, the mask 14 has a configuration in which a plurality of openings (not shown) are provided on a metal film. Specifically, the mask 14 has a plurality of openings arranged corresponding to the positions of the respective pixels of the organic EL display device.

Figure 14:
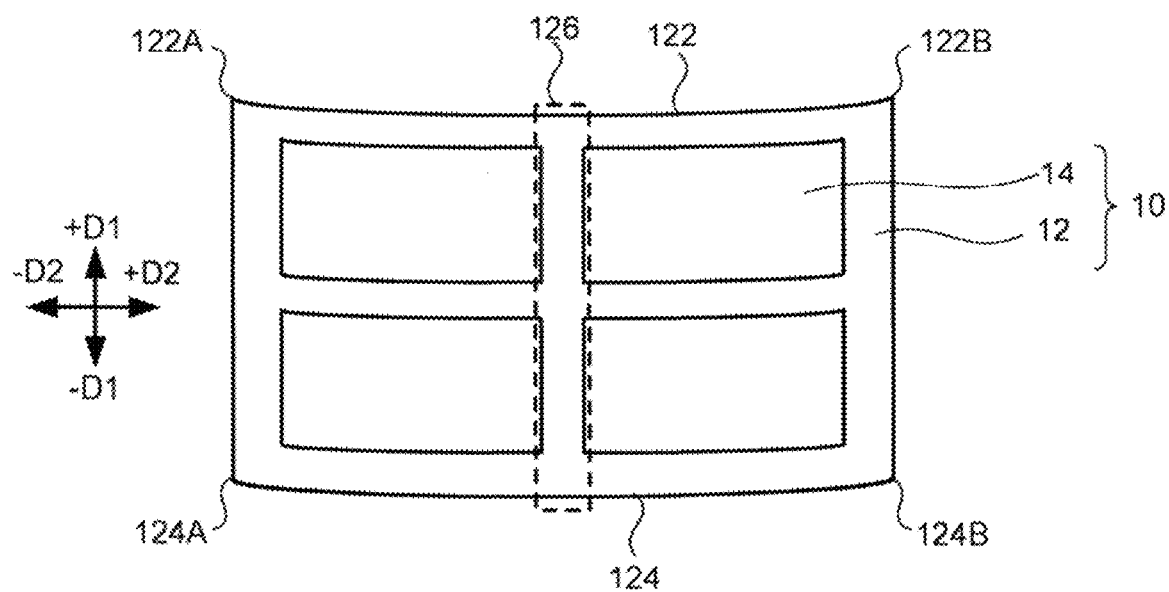
FIG. 14 is a front view showing an example of an appearance when arranging a vapor deposition mask upright.

FIG. 14 is a front view showing an example of an appearance when arranging the vapor deposition mask 10 upright. As shown in FIG. 14, the vapor deposition mask 10 is deflected in the −D1 direction by its own weight. As a result, the vicinity of the center of the first side 122 is curved in the −D1 direction as compared with the corners 122A, 122B. The vicinity of the center of the second side 124 is curved in the −D1 direction as compared with the corners 124A,124B. For example, if the mask frame 12 is of symmetrical configuration, the deflection is maximized at the position where the partition 126 exists.

Figure 15:
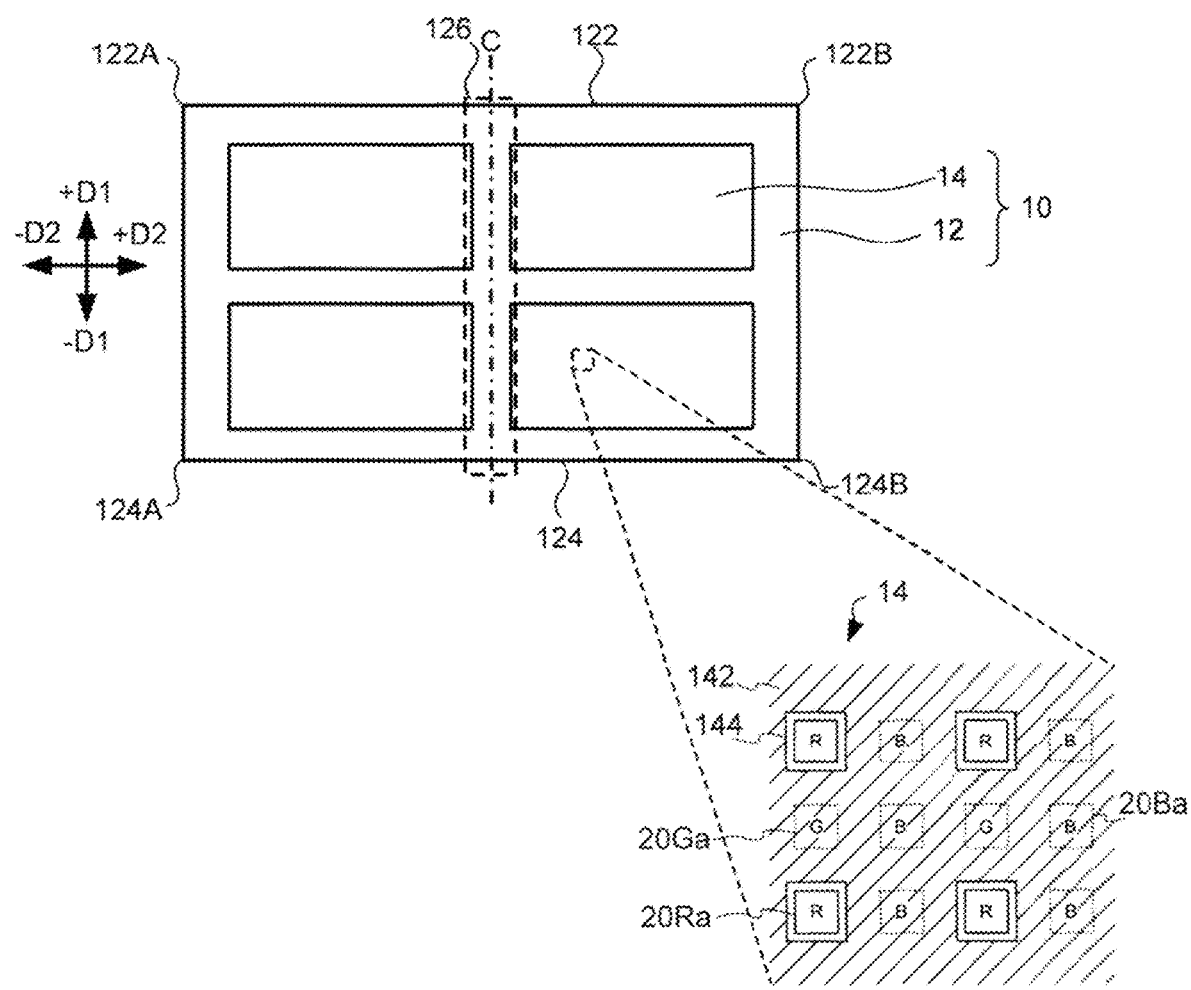
FIG. 15 is a plan view showing an alignment of a vapor deposition mask when no deflection has occurred in a vapor deposition mask.

FIG. 15 is a plan view showing an alignment of a vapor deposition mask when no deflection has occurred in the vapor deposition mask 10. Here, an enlarged view schematically showing an opening 144 provided on the mask 14 to actually vapor-deposit the organic EL material is also shown. FIG. 15 shows a light-emitting region 20Ra that emits red light, a light-emitting region 20Ga that emits green light, and a light-emitting region 20Ba that emits blue light. Here, the "light-emitting region" refers to a region that actually emits light out of pixels. Specifically, it refers to a region located inside a bank of an upper surface of a pixel electrode described later.

In an example shown in FIG. 15, a plurality of openings 144 provided in a metal film 142 constituting the mask 14 are aligned with respect to the light-emitting region 20Ra. Therefore, by performing a vapor deposition of the organic EL material emitting red light in the state shown in FIG. 14, a light-emitting layer that emits red light with respect to the light-emitting region 20Ra is formed.

Figure 16:
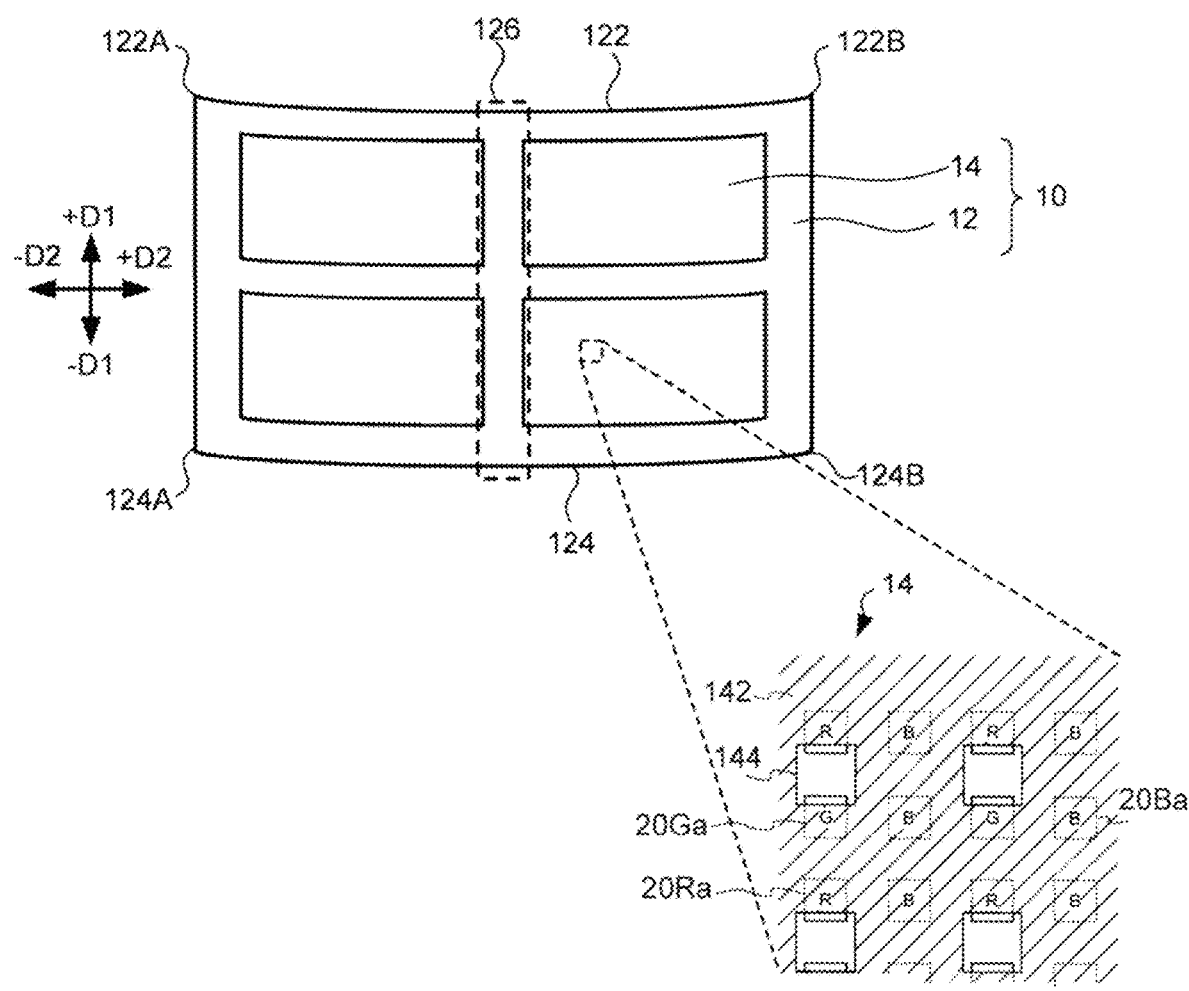
FIG. 16 is a plan view showing an alignment of a vapor deposition mask when a deflection has occurred in a vapor deposition mask.

FIG. 16 is a front view showing an alignment of a vapor deposition mask when the deflection has occurred in the mask 14. In this case, the position of the opening 144 is shifted in the −D1 direction by the deflection of the mask 14 due to its own weight, the position of the light-emitting region 20Ra and the opening 144 is not aligned. As a result, in FIG. 16, the light-emitting layer that emits red light is formed across the light-emitting region 20Ra and the light-emitting region 20Ga. Such poor formation of the emitting layer may result in a generation of a color mixture of pixels or a reduction in the yield of the manufacturing process. The vapor deposition apparatus 1 described below has a configuration for solving such problems.

Figure 2:
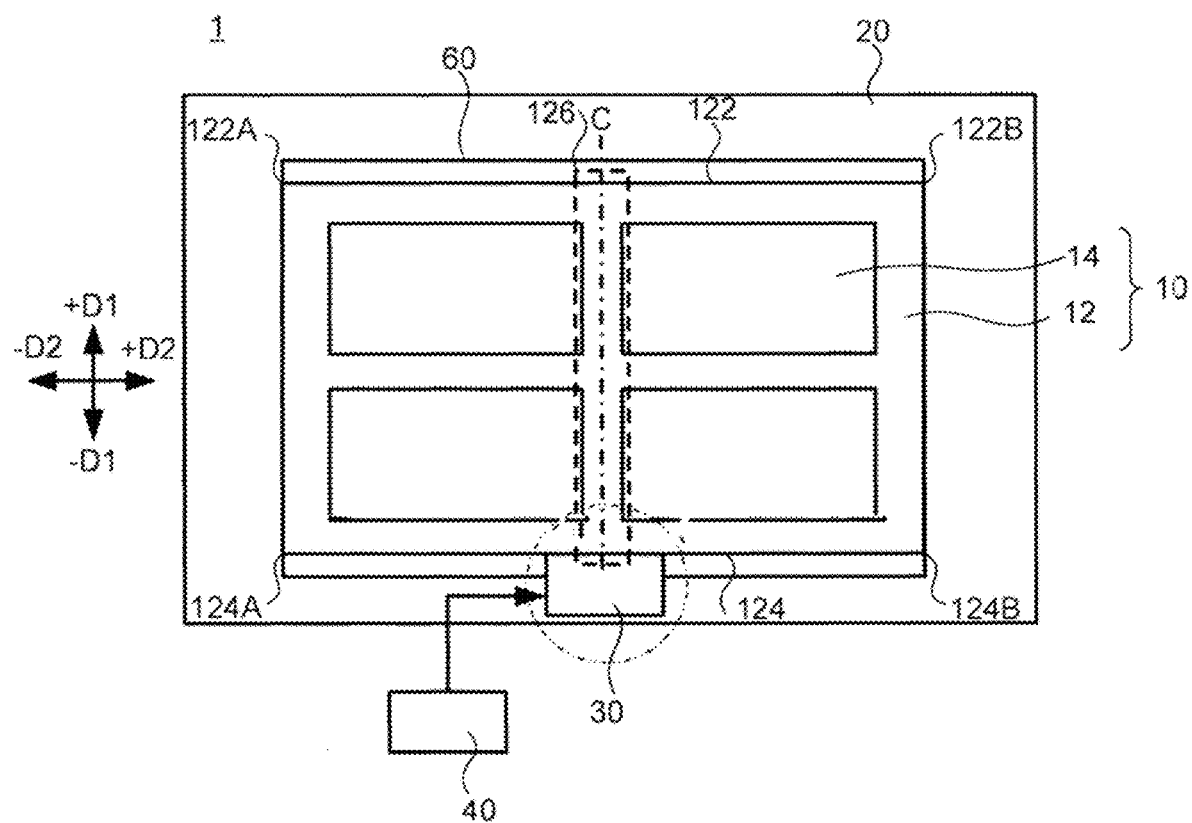
FIG. 2 is a front view showing a configuration inside a vapor deposition apparatus according to the first embodiment.

FIG. 2 is a front view showing a configuration inside the vapor deposition apparatus 1 according to the first embodiment. The vapor deposition apparatus 1 is an organic EL device manufacturing apparatus that vapor-deposits a thin film for manufacturing an organic EL device in a vacuum environment. The vapor deposition apparatus 1 includes the vapor deposition mask 10, a base frame 20, a correction mechanism 30, and a control mechanism 40. During the vapor deposition, the vapor deposition mask 10 is arranged to face the base frame 20. The mask frame 12 is fixed to the base frame 20 by using pins, for example, at four points on the corners 122A,122B,124A,124B. During the vapor deposition, a substrate 60, on which the vapor deposition material is vapor-deposited, is arranged to face the vapor deposition mask 10. The base frame 20 is made of a material having a high rigidity. The base frame 20 is at least higher in rigidity than the mask frame 12, less likely to deform than the mask frame 12. Typically, the substrate 60 is a glass substrate or has a resin substrate layer formed on its surface using a glass substrate as a support substrate. The substrate 60 is less likely to be deformed in the gravity direction than the vapor deposition mask 10 when arranged upright, as compared with the vapor deposition mask 10 provided with the mask 14 formed by electroforming in the opening. The correction mechanism 30 is a mechanism for correcting the deflection of the gravity direction occurring in the mask frame 12. The deflection of the mask frame 12 refers to the deformation of the mask frame 12 caused by the weight of the mask frame 12. The correction mechanism 30 corrects the deflection by applying a force to a predetermined position of the mask frame 12. Correction of the deflection includes applying a force in the +D1 direction, which is the direction of reducing deflection, to a position where the deflection occurs in the mask frame 12. In the present embodiment, the correction mechanism 30 applies a force on a position on the axis C among the positions on the second side 124 of the mask frame 12. The correction mechanism 30 is one in the present embodiment but may be a plurality of the correction mechanisms 30. The control mechanism 40 controls the driving of the correction mechanism 30.

Figure 3:
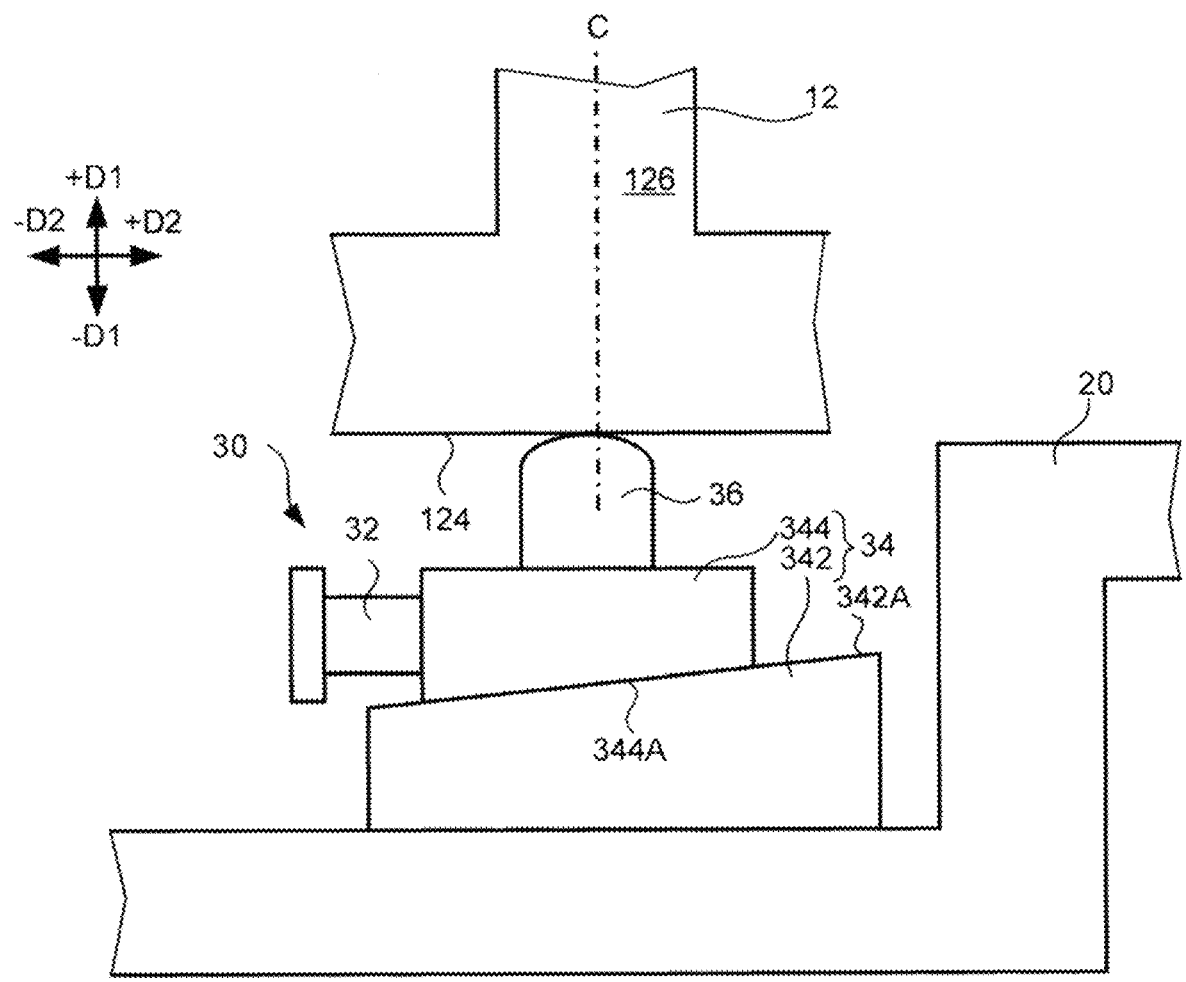
FIG. 3 is an enlarged view showing a correction mechanism and its surroundings according to the first embodiment.

FIG. 3 is an enlarged view of the correction mechanism 30 and its surroundings. The correction mechanism 30 includes a first moving member 32, a reduction mechanism 34, and a second moving member 36. The correction mechanism 30 is fixed to the base frame 20. The first moving member 32 moves in the +D2 direction or the −D2 direction in response to an external force given by the control of the control mechanism 40. The first moving member 32 may be a micrometer head. The second moving member 36 is provided at a position contacting the mask frame 12. In this embodiment, the second moving member 36 contacts a position on the axis C of the second side 124. The reduction mechanism 34, when the first moving member 32 moved by a first displacement amount, moves the second moving member 36 by a second displacement amount smaller than the first displacement amount.

The reduction mechanism 34 includes a first member 342 and a second member 344. The first member 342 has an inclined plane 342A on its upper surface. The second member 344 has an inclined plane 344A on its lower surface. The inclined plane 342A of the first member 342 and the inclined plane 344A of the second member 344 contact each other. The second member 344, in response to the first moving member 32 is moved, moves along the inclined plane 342A of the first member 342. The second moving member 36 moves in response to the movement of the second member 344. Depending on the gradients of the inclined plane 342A and the inclined plane 344A, the relationship between the displacement amount in the +D2 direction or the −D2 direction of the first moving member 32 and the displacement amount in the +D1 direction or the −D1 direction of the second moving member 36 is determined.

Figure 4:
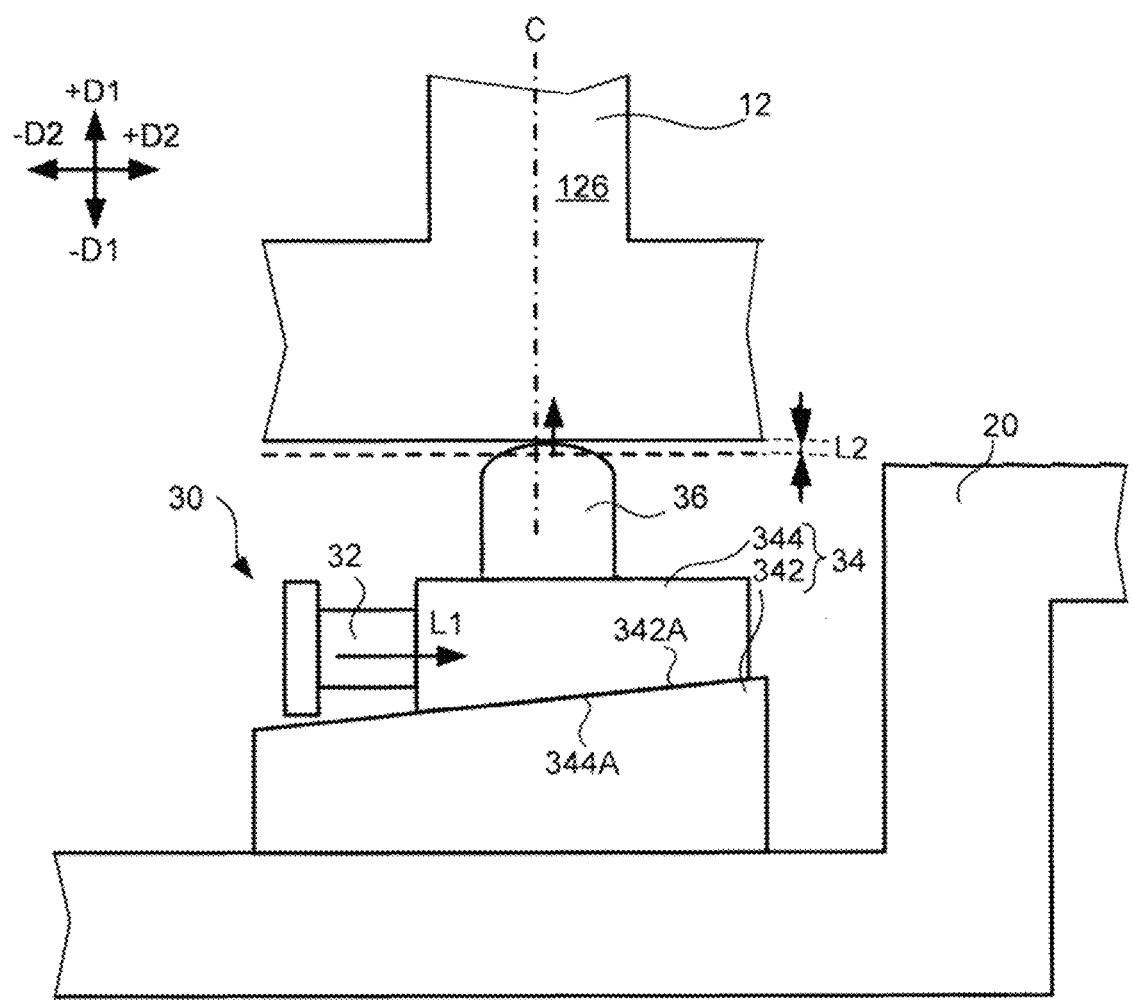
FIG. 4 is an enlarged view showing a correction mechanism and its surroundings according to the first embodiment.

As shown in FIG. 4, when the first moving member 32 moves in the +D2 direction by the distance L1, the second moving member 36 moves in the +D1 direction by the distance L2 (L2<L1). Thus, the second moving member 36 provides a force to push up the mask frame 12 in the +D1 direction. That is, the second moving member 36 reduces the deflection of the mask frame 12. On the contrary, when the first moving member 32 is moved in the −D2 direction by the distance L1, the second moving member 36 is moved in the −D1 direction by the distance L2. Thus, the mask frame 12 supported by the second moving member 36 is lowered in the −D1 direction by the distance L2.

The reason for using the reduction mechanism 34 is to accurately correct the minute deflection occurring in the mask frame 12. For example, the moving amount of the first moving member 32 is reduced to 1/50 and transmitted to the second moving member 36. As a result, the displacement of the second moving member 36 can be controlled more finely. The reason why the correction mechanism 30 applies a force at a position intersecting the partition 126 of the second side 124 is to lift the second side 124 in the +D1 direction while suppressing the mask frame 12 from deflecting when a force is applied to the mask frame 12.

The inclined plane 342A and the inclined plane 344A are sliding surfaces contacting each other. The inclined plane 342A and the inclined plane 344A are not coated with a lubricant such as oil. This is because the correction mechanism 30 is used in a vacuum environment. Again, at least a part of the inclined planes 342A and 344A are preferably coated with a material that reduces a coefficient of friction so that the second member 344 moves smoothly relative to the first member 342. Coatings of a material that do not generate dust due to the sliding of the inclined planes 342A and 344A are further be desirable. The material of the coating may be molybdenum disulfide, Teflon (Registered Trademark), diamond-like carbon, or other materials.

Before the vapor deposition, the control mechanism 40 specifies the magnitude of the deflection of the mask frame 12 in the −D1 direction and controls the driving of the correction mechanism 30 to lift the mask frame 12 in the +D1 direction based on the magnitude of the deflection. The method of specifying the magnitude of the deflection is not particularly limited. For example, using an alignment camera, there is a method of specifying the distance (i.e., the amount of misalignment) in the −D1 direction between a predetermined position in the substrate and a predetermined position in the mask frame 12 as the magnitude of deflection.

According to the first embodiment described above, as compared with the case where the vapor deposition apparatus 1 does not have the correction mechanism 30, the deflection due to its own weight of the mask frame 12 is reduced. As a result, in the vapor deposition apparatus 1, it is possible to suppress the deposition failure caused by the deflection of the vapor deposition mask.

Second Embodiment

Figure 5:
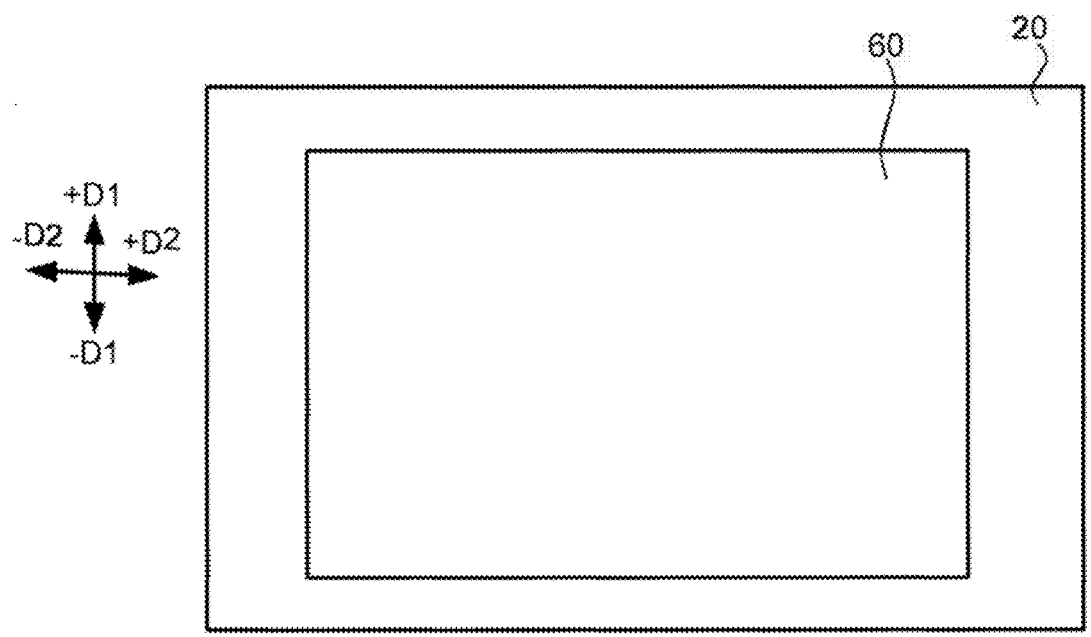
FIG. 5 is a front view showing a configuration inside a vapor deposition apparatus according to the second embodiment.

The second embodiment describes a manufacturing method of the organic EL display device. FIG. 5 and FIGS. 7 to 9 are front views showing configurations inside the deposition apparatus 1. First, as shown in FIG. 5, arranging the substrate 60 to face the base frame 20. The substrate 60 may be fixed to the base frame 20 or may be held by a separately provided substrate holder (not shown). The substrate 60 is a substrate on which an organic EL material is vapor-deposited to form a light-emitting layer. The substrate 60 has a configuration shown in FIG. 6, for example, by the processing of the previous step.

Figure 6:
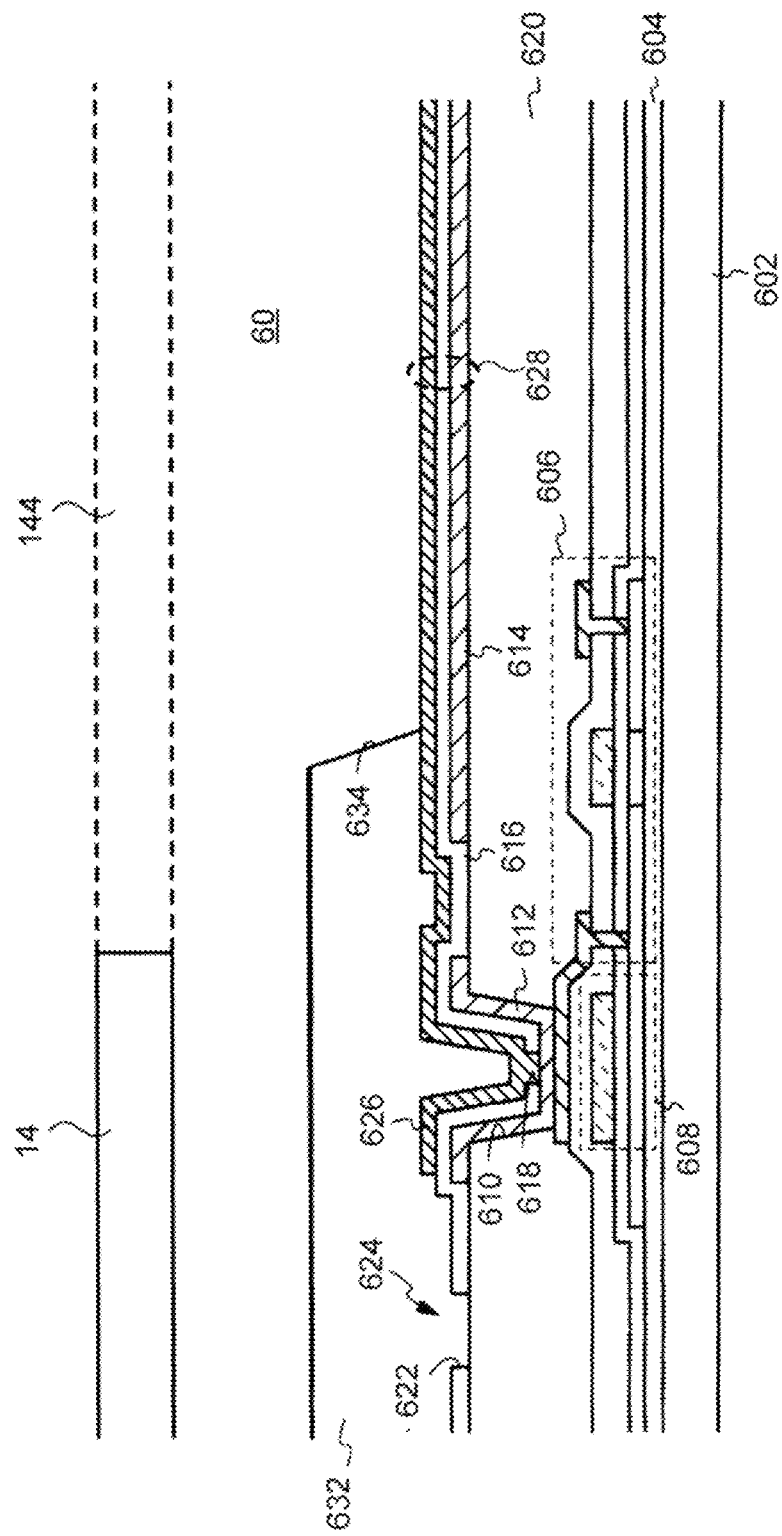
FIG. 6 is a cross-sectional view of a substrate according to the second embodiment.

FIG. 6 is a cross-sectional view of the substrate 60. Above a support substrate 602, a thin film transistor 606 is provided via a base film 604. The support substrate 602 is, for example, a glass substrate, but may be a substrate made of acrylic, polyimide, or other resinous materials. The base film 604 is, for example, an inorganic insulating film such as a silicon oxide film, a silicon nitride film, or a silicon oxide nitride film.

The thin film transistor 606 is a so-called top gate type thin film transistor. However, it is not limited thereto, it may be any type of thin film transistor. The thin film transistor 606 functions as a driving transistor that supplies a current to an organic EL element 640. In the present embodiment, an N-channel type transistor is used as the thin film transistor 606. Since the structure of the thin film transistor 606 is a known structure, a detailed description thereof will be omitted.

A storage capacitor 608 is electrically connected to the thin film transistor 606. The storage capacitor 608 can be configured by utilizing two conductive films that compose the thin film transistor 606 and an insulating film provided therebetween. For example, the storage capacitor 608 of the present embodiment can be formed using a semiconductor layer constituting an active layer of the thin film transistor 606, a gate insulating film, and a capacitance electrode (an electrode formed simultaneously with a gate electrode). However, the structure of the storage capacitor 608 is not limited to this.

The thin film transistor 606 is covered with an organic insulating film 620. The organic insulating film 620 functions as a planarization film that planarizes the undulation due to the shape of the thin film transistor 606. The organic insulating film 620 is, for example, an insulating film including a resin material such as an acrylic resin or a polyimide resin.

The organic insulating film 620 is provided with an opening 610. The opening 610 is covered with an oxide conductive film 612. The oxide conductive film 612 has, for example, a configuration in which a thin film made of a metal oxide material such as ITO (Indium Tin Oixde), IZO (Indium Zinc Oixde) is patterned. The oxide conductive film 612 is electrically connected to a part of the thin film transistor 606 (specifically, a source electrode) exposed by the opening 610.

On an upper surface of the organic insulating film 620, a lower electrode 614 of a storage capacitor 628 is formed using the oxide conductive film formed simultaneously with the oxide conductive film 612. The lower electrode 614 is provided below the organic EL element 640 (see FIG. 12). As will be described later, since the organic EL element 640 of the present embodiment is configured to emit light upward, it is possible to form the storage capacitor 628 by utilizing the space below the organic EL element.

Above the oxide conductive film 612 and the lower electrode 614, an inorganic insulating film 616 is provided. The inorganic insulating film 616 is, for example, a silicon nitride film, but is not limited thereto, and may be another inorganic insulating film such as a silicon oxide film or a silicon oxide nitride film. The inorganic insulating film 616 is provided with an opening 622 that exposes the organic insulating film 620. The opening 622 functions as a drain region 624. The drain region 624 serves as releasing water and the like to outside. Water and the like is generated from the organic insulating film 620 by the heating step after forming the organic insulating film 620.

Above the inorganic insulating film 616, a pixel electrode 626 is provided. The pixel electrode 626 is connected to the oxide conductive film 612 via an opening 618 provided in the inorganic insulating film 616. That is, the pixel electrode 626 is connected to the thin film transistor 606 via the oxide conductive film 612. The pixel electrode 626 functions as the top electrode of the storage capacitor 628 as well as functions as the anode (anode electrode) of the organic EL element 640.

As the pixel electrode 626, for example, a conductive film with a laminated structure in which a layer containing silver is sandwiched between oxide conductive films is used. Specifically, the pixel electrode 626 is composed of an IZO layer, a silver layer and an IZO layer. However, it is also possible to use an ITO layer instead of the IZO layer. To configure the light emitted from the organic EL element 640 to emit upward, the pixel electrode 626 preferably includes a reflective conductive film. Therefore, in the present embodiment, a layer made of a metal material containing silver or silver alloy having high reflectivity is used for a part of the pixel electrode 626. In this embodiment, a silicon nitride film is used for the inorganic insulating film 616 used as a dielectric of the storage capacitor 628. Since a silicon nitride film has a higher dielectric constant than a silicon oxide film or the like, it has an advantage of easily securing a large capacitance. Furthermore, since the storage capacitor 628 can be arranged by effectively utilizing the space below the organic EL element, it is easy to secure a large area of the storage capacitor 628.

A part of the pixel electrode 626 is covered with a bank 632 made of an organic material. In particular, the bank 632 includes an opening 634 that covers the edge of the pixel electrode 626 and exposes a part of the top surface of the pixel electrode 626. A part of the top surface of the exposed pixel electrode 626 (i.e., of the top surface of the pixel electrode 626, a region located inside the opening 634 of the bank 632) becomes a substantial light-emitting region of a pixel 20a. That is, the bank 632 defines a light-emitting region of the pixel 20a. The organic material constituting the bank 632 is, for example, a resin material such as a photosensitive acrylic resin or a polyimide resin but is not limited thereto.

A light-emitting layer (a light-emitting layer 636 described later) is formed on a region of the upper surface of the pixel electrode 626 that does not overlap the bank 632 (i.e., a region inside the opening 634). In the present embodiment, the light-emitting layer is formed separately for each pixel using a vapor deposition method using the vapor deposition apparatus 1. As the light-emitting layer, for example, an organic EL material which emits light in either red, blue, or green can be used. Functional layers such as an electron transport layer or a positive hole transport layer other than the light-emitting layer may be provided commonly for a plurality of pixels. There is no particular limitation on the light-emitting layer which can be used in this embodiment and known materials can be used. The configuration of the substrate 60 has been described above.

Figure 7:
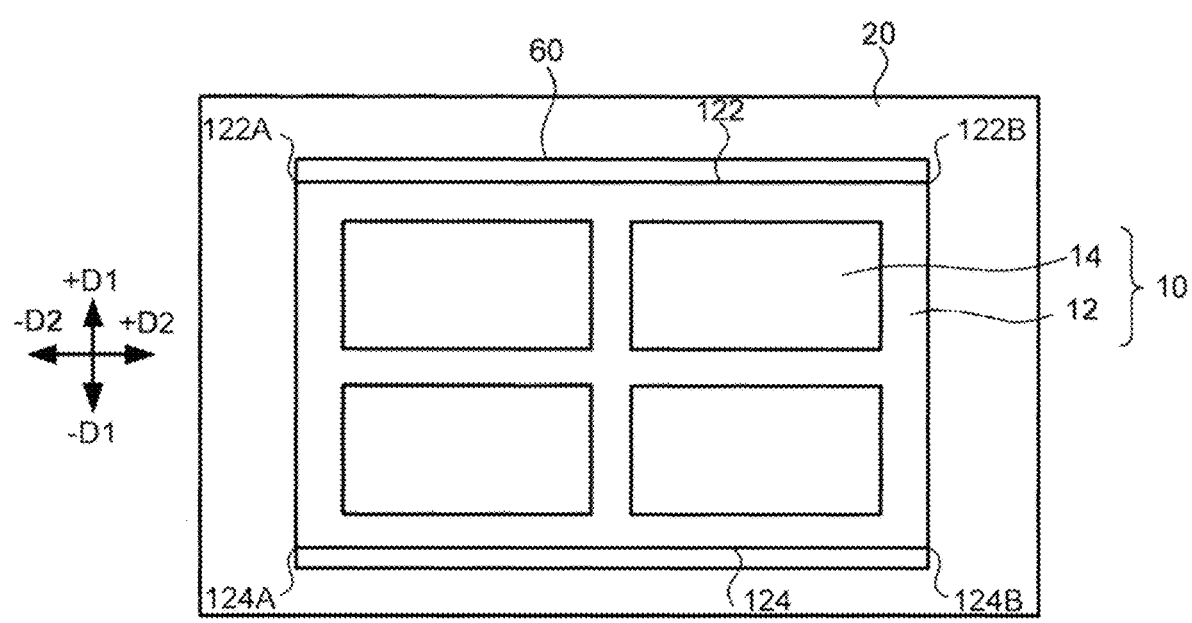
FIG. 7 is a front view showing a configuration inside a vapor deposition apparatus according to the second embodiment.
Figure 8:
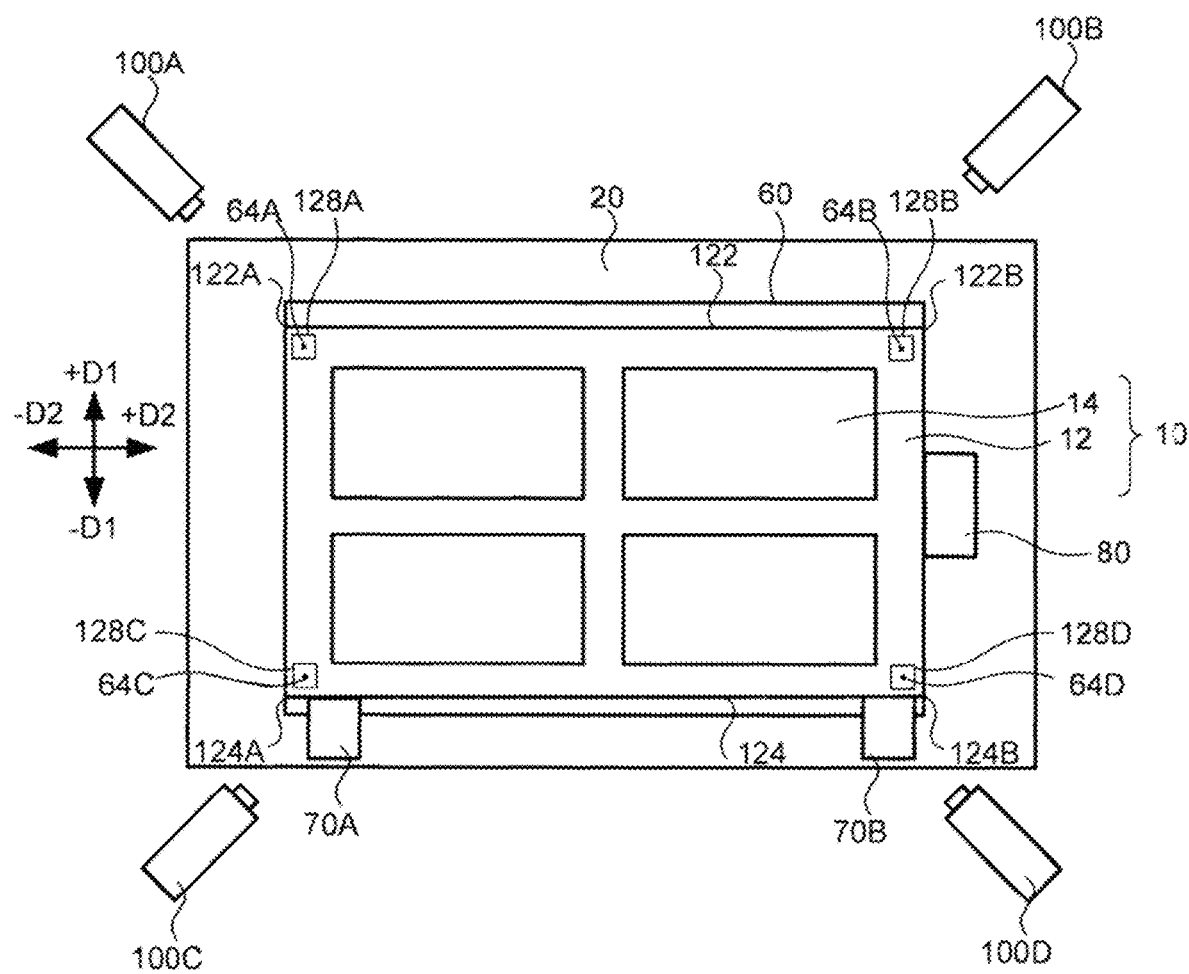
FIG. 8 is a diagram showing an example of a method for aligning a vapor deposition mask and a substrate according to the second embodiment.

Next, as shown in FIG. 7, the mask frame 12 (in other words, the vapor deposition mask 10) is arranged to face the substrate 60. When arranging the mask frame 12 to face the substrate 60, a predetermined first position in the substrate 60 and a predetermined second position in the mask frame 12 are aligned with each other. FIG. 8 is a diagram showing an example of a method for aligning the mask frame 12 and the substrate 60. In this example, alignment marks 128A, 128B,128C,128D are provided on predetermined respective positions (the first position) in the vicinity of the corners 122A,122B,124A,124B of the mask frame 12. The reason why the alignment mark is provided in the vicinity of the corners 122A,122B,124A,124B, is to perform alignment at the position of the mask frame 12 where the deflection is relatively small.

Alignment marks 64A,64B,64C,64D are provided on predetermined respective positions (the second position) of the upper surface of the substrate 60. Four alignment cameras are provided to image the vicinity of each of the corners 122A,122B,124A,124B. An alignment camera 100A images the alignment mark 128A and the alignment mark 64A. An alignment camera 100B images the alignment mark 128B and the alignment mark 64B. An alignment camera 100C images the alignment mark 128C and the alignment mark 64C. An alignment camera 100D images the alignment mark 128D and the alignment mark 64D. Based on these imaging results, aligning mechanisms 70A, 70B provided closer to the −D1 direction than the vapor deposition mask 10 control the position and inclination of the vapor deposition mask 10 in the +D1 direction or −D1 direction. An aligning mechanism 80, which is located on the +D2 direction side of the vapor deposition mask 10, adjusts the position of the vapor deposition mask 10 in the +D2 or −D2 direction. The alignment method is not limited to this, and other methods may be used. The alignment position may be 3 or less or 5 or more.

Figure 9:
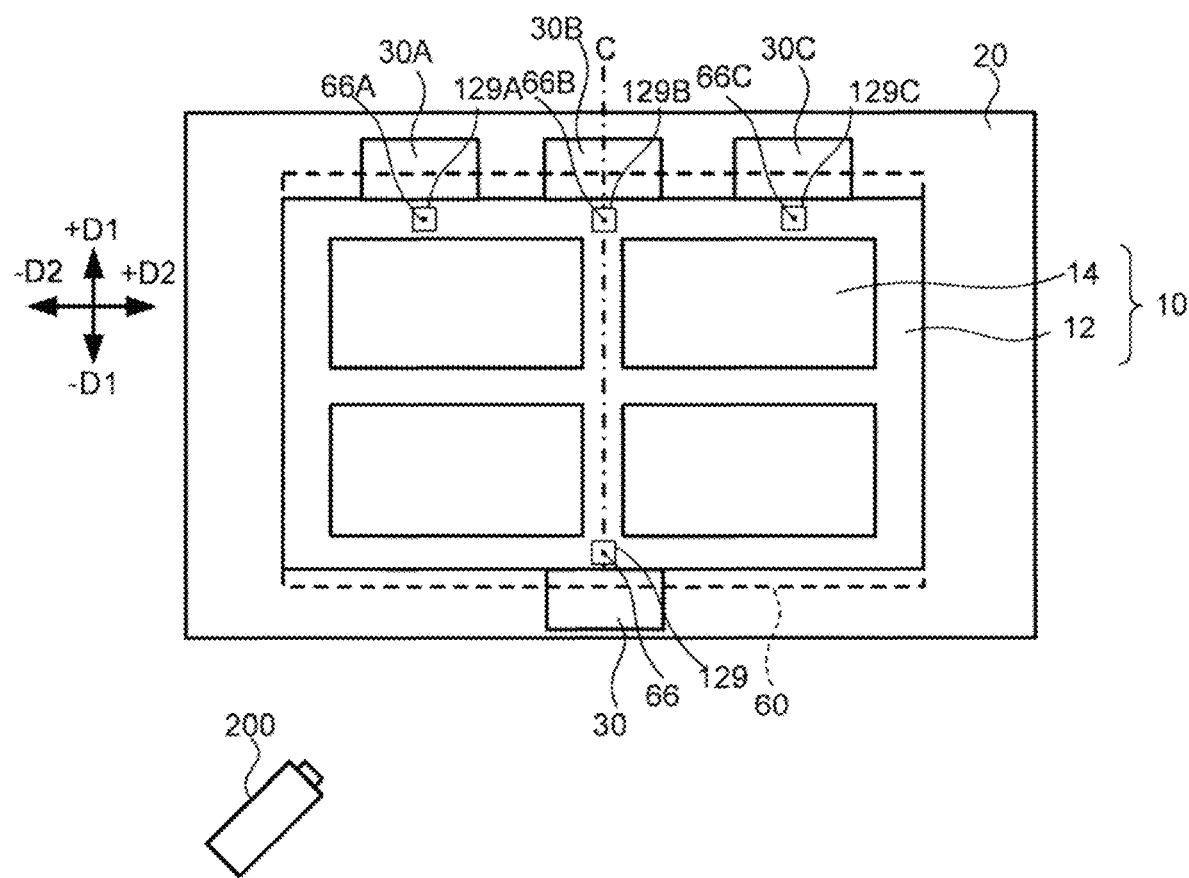
FIG. 9 is a diagram showing an example of a method for correcting a deflection of a vapor deposition mask according to the second embodiment.

Next, as shown in FIG. 9, the deflection of the mask frame 12 is corrected. In this example, correction mechanisms 30A,30B,30C are provided in addition to the correction mechanism 30 described in the first embodiment. Each of the correcting mechanisms 30A,30B,30C is provided closer to the +D1 direction side than the mask frame 12. The correction mechanisms 30A,30B,30C correct the deflection by applying a force to the position where the deflection of the mask frame 12 occurs. The correction mechanism 30B applies a force on a position on the axis C among the position on the first side 122 of the mask frame 12. That is, the correction mechanism 30B applies a force to the mask frame 12 at a position where the first side 122 and the partition 126 (see FIG. 1) intersect. The correction mechanisms 30A,30C correct the deflection by applying a force to the positions on both sides sandwiching the axis C among the first side 122 of the mask frame 12. For example, the correction mechanisms 30A,30B,30C may be arranged at positions separated by a distance of ¼ the horizontal dimension of the mask frame 12. The correction mechanisms 30A,30B,30C may be fixed to the base frame 20. When the mask frame 12 is pulled from the +D1 direction side, the degree of freedom in the arrangement position of the correction mechanism is higher than when lifting from the −D1 direction side.

The correction mechanisms 30A,30B,30C are common to the correction mechanism 30 in that it applies a force in the +D1 direction on the mask frame 12, but different in that apply a force in a direction to which the mask frame 12 is pulled upward. That is, when the mask frame 12 is pulled up in the +D1 direction, the first moving member 32 of each of the correction mechanisms 30A,30B,30C is moved in the −D2 direction. When the mask frame 12 is pulled down in the −D1 direction, the first moving member 32 of each of the correction mechanisms 30A,30B,30C is moved in the +D2 direction.

Figure 10:
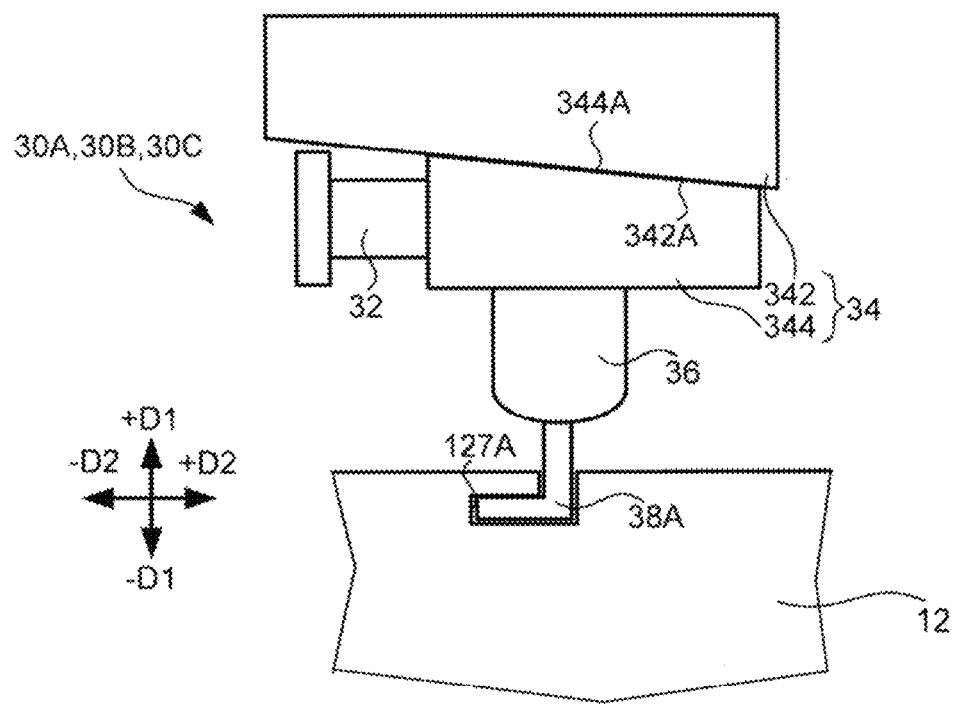
FIG. 10 is a diagram illustrating an example of a method for connecting a correction mechanism and a mask frame according to the second embodiment.

FIG. 10 is a diagram illustrating an example of a method for connecting each of the correction mechanisms 30A,30B, 30C to the mask frame 12. In the example of FIG. 10, a concave part 127A is formed on the upper surface of the mask frame 12. The concave part 127A has a part extending in the −D2 direction, here it is the L-shape. The concave part 127A is provided from one end to the other end of the mask frame 12 (i.e., from the front to the back of the mask frame 12) in the thickness direction of the mask frame 12, that is, in a direction intersecting the +D1 direction and the +D2 direction. In addition to the configuration of the correction mechanism 30, the correction mechanisms 30A,30B,30C have an insertion part 38A that is inserted into the concave part 127A. The insertion part 38A is provided in the second moving member 36 and is shaped to be hooked to the concave part 127A. The insertion part 38A has a part extending in the −D2 direction similar to the concave part 127A, here it is the L-shape. The insertion part 38A has a shape and dimensions corresponding to the concave part 127A. By inserting the insertion part 38A into the concave part 127A, the mask frame 12 is fixed to the correction mechanisms 30A,30B,30C. When the mask frame 12 is arranged, the insertion part 38A is inserted from opening at one end of the concave part 127A, so that the mask frame 12 is connected to each of the correction mechanisms 30A,30B, 30C. The insertion part 38A may be integrally molded with the second moving member 36.

Figure 11:
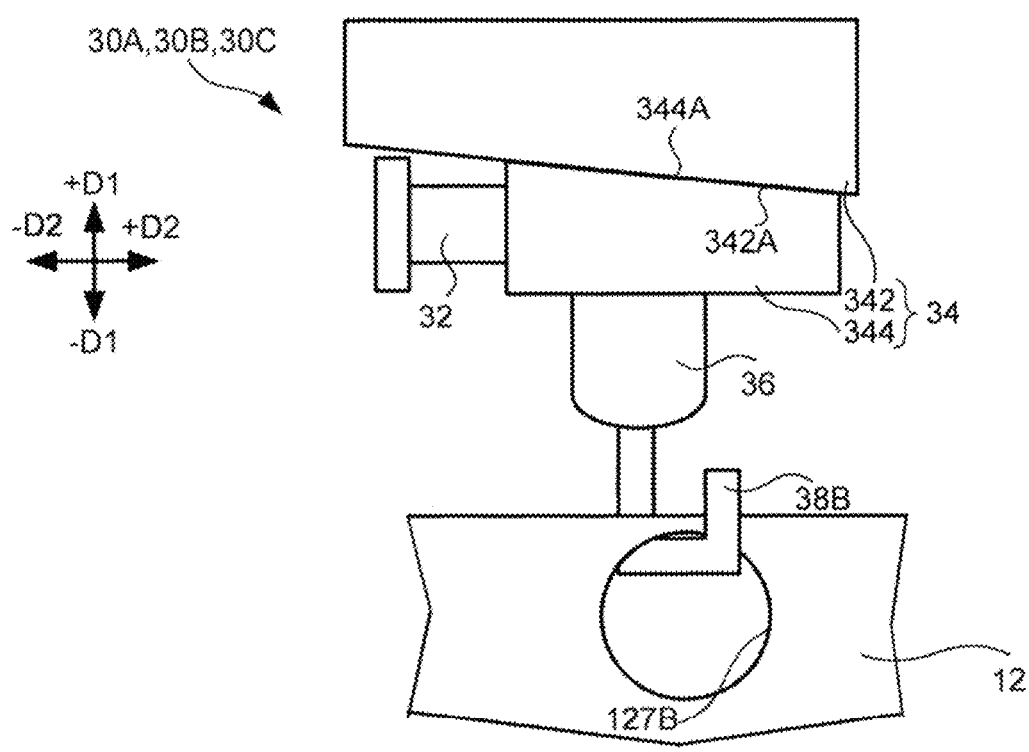
FIG. 11 is a diagram illustrating an example of a method for connecting a correction mechanism and a mask frame according to the second embodiment.

FIG. 11 is a diagram illustrating other example of a method for connecting each of the correcting mechanisms 30A,30B,30C and the mask frame 12. In the example shown in FIG. 11, the mask frame 12 has a hole 127B penetrating the front and back sides thereof. The hole 127B is here a cylindrical shape but may be other shapes. The correction mechanisms 30A,30B,30C have an insertion part 38B to be inserted into the hole 127B. The insertion part 38A is insertable into the hole 127B and shaped to be hooked to the hole 127B. When arranging the mask frame 12, by inserting the insertion part 38B from the opening at one end of the hole 127B, the mask frame 12 is connected to each of the correction mechanisms 30A,30B,30C. The insertion part 38B may be integrally molded with the second moving member 36 described above. The method for connecting each of the correction mechanisms 30A,30B,30C described in FIGS. 10 and 11 to the mask frame 12 is merely an example, and other methods of connecting may be used.

A method for correcting the deflection of the vapor deposition mask 10 will be described. As shown in FIG. 9, an alignment mark 129 is provided at a predetermined position (a third position) in the vicinity of the correction mechanism 30 of the mask frame 12. An alignment mark 66 is provided at a predetermined position of an upper surface of the substrate 60 (a fourth position). Alignment marks 129A,129B,129C are provided at the predetermined position (the third position) in the vicinity of each of the correction mechanisms 30A,30B,30C of the mask frame 12. Alignment marks 66A,66B,66C (the fourth position) are provided at the predetermined position of the upper surface of the substrate 60. The alignment marks 129 and 129A,129B,129C are provided at least at positions different from the alignment marks 128A,128B,128C,128D. For example, the alignment marks 129 and 129A,129B,129C are provided at positions where the deflection due to the weight of the mask frame 12 can occur. An alignment camera 200 images the positions where at least the alignment marks 129, 129A,129B,129C are formed. Here, although the alignment camera 200 is moved by a moving mechanism (not shown) to image the entire vapor deposition mask 10, the alignment camera may be provided corresponding to each of the alignment positions. Based on these imaging results, the control mechanism 40 specifies the magnitude of the deflection at each alignment position, and controls the driving of the correction mechanisms 30, 30A,30B,30C based on the magnitude of the deflection. The magnitude of the deflection at the respective positions of the mask frame 12 is specified based on a distance between the alignment mark 129 and the alignment mark 66, a distance between the alignment mark 129A and the alignment mark 66A, a distance between the alignment mark 129B and the alignment mark 66B, and a distance between the alignment mark 129C and the alignment mark 66C. The control mechanism 40 controls the driving of each of the correction mechanisms 30 and 30A,30B,30C so as to reduce the deflection at the respective positions of the alignment marks 129 and 129A,129B,129C. After this correction, the vapor deposition apparatus 1 vapor-deposits an organic EL material on the substrate 60 by using a vapor deposition source (not shown).

Figure 12:
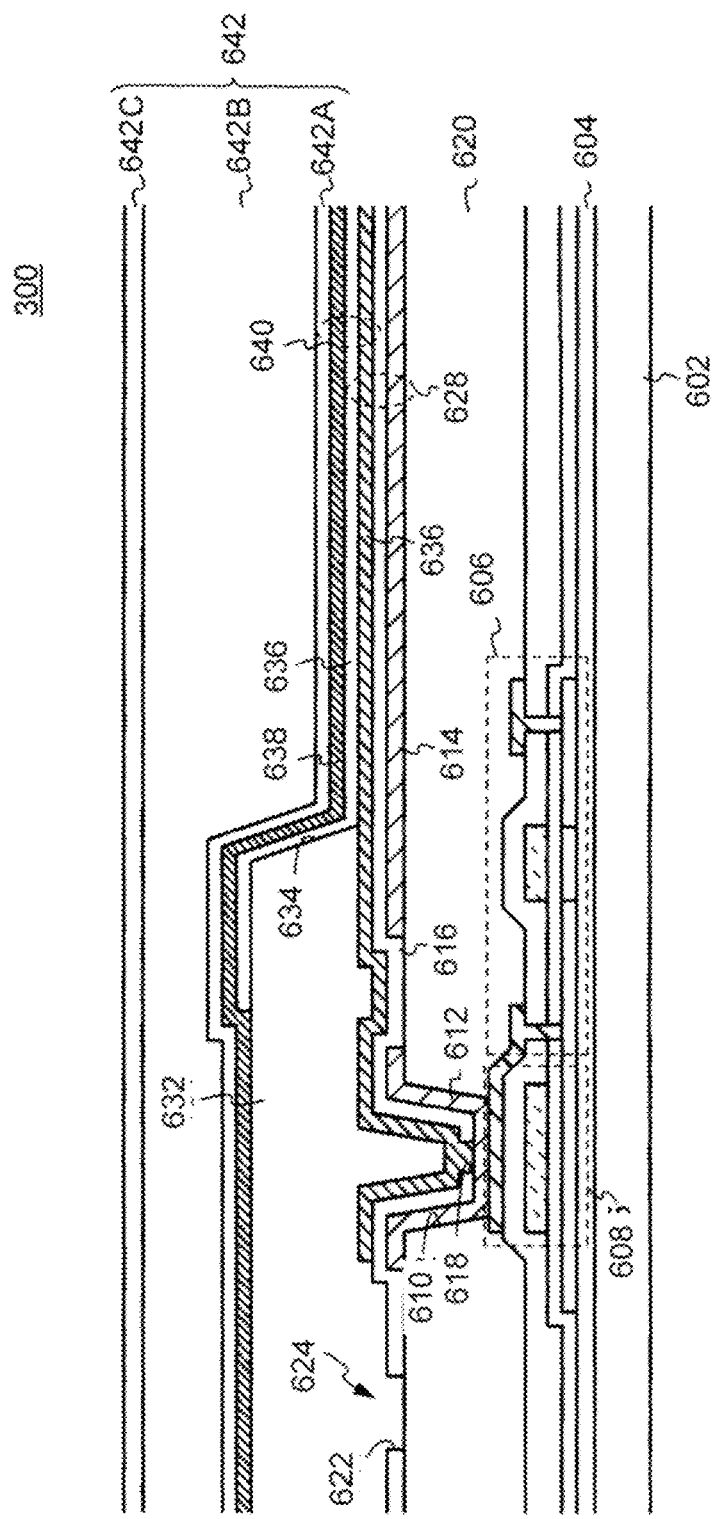
FIG. 12 is a cross-sectional view of an organic EL display device according to the second embodiment.

An organic EL display device 300 is completed when the organic EL material is vapor-deposited to form a light-emitting layer and further undergoes post-process processing. FIG. 12 is a cross-sectional view of the organic EL display device 300. As shown in FIG. 12, a common electrode 638 made of a conductive film containing a group 1 element or a group 2 element is provided on the light-emitting layer 636. As such a conductive film, for example, a magnesium (Mg) film, a lithium (Li) film, or the like can be used. The common electrode 638 functions as a cathode (cathode electrode) of the organic EL element 640. The common electrode 638 is provided over a plurality of pixels.

In the case of the top emission type display device that extracts the light emitted from the light-emitting layer 636 toward the top side, that is, the common electrode 638 side, the common electrode 638 is required to be transparent to light. When a conductive film containing the above-mentioned group 1 element or group 2 element is used as the common electrode 638, the thickness of the common electrode 638 is reduced to such an extent that the emitted light is transmitted to in order to impart light transmission. The organic EL element 640 is configured by the pixel electrode 626, the light-emitting layer 636 and the common electrode 638 described above.

Above the common electrode 638 (i.e., above the organic EL element 640) is provided with a sealing film 642. The sealing film 642 of the present embodiment is composed of three layers including a first sealing film 642A composed of an inorganic material, a second sealing film 642B composed of an organic material, and a third sealing film 642C composed of an inorganic material in this order from below. These sealing films have the function of preventing the intrusion of moisture and the like from the outside and preventing deterioration of the light-emitting layer 636 and the common electrode 638. The first sealing film layer 642A and the third sealing film layer 642C are, for example, a silicon nitride film, but may be a silicon oxide film or a silicon oxide nitride film. In other words, an inorganic insulating film can be used as the first sealing film 642A. As the inorganic insulating film, it is particularly preferable to use an insulating film containing silicon nitride. The second sealing film material 642B is, for example, an organic insulating film made of a resin material.

According to the second embodiment described above, it is possible to form the light-emitting layer 636 of the organic EL display device 300 by correcting the deflection due to its own weight of the mask frame 12.

Other Embodiments

Figure 13:
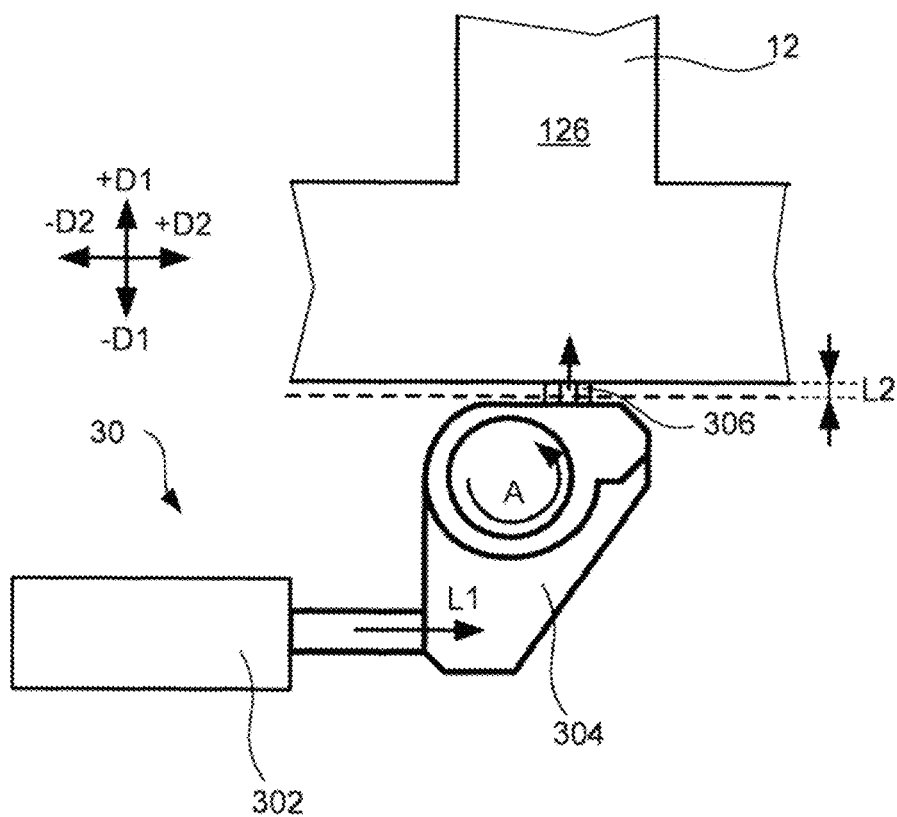
FIG. 13 is a diagram showing another example of a configuration of a correction mechanism.

The correction mechanism 30 is not limited to the configuration described above, and may be, for example, a configuration shown in FIG. 13. In this case, the correction mechanism 30 includes a first moving member 302, a rotating cam 304, and a second moving member 306. The first moving member 302 moves according to an external force. The second moving member 306 is provided at a position where it contacts the mask frame 12. The rotating cam 304 converts the linear motion of the first moving member 302 into a rotational motion in the direction of arrow A and transmits to the second moving member 306. Thus, when the first moving member 302 is moved by the first displacement amount, the rotating cam 304 moves the second moving member 306 by a second displacement amount smaller than the first displacement amount. It is desirable that no lubricant is used on the sliding surface of the rotating cam 304 and is coated to reduce the coefficient of friction.

The correction mechanism 30 may not have a reduction mechanism as long as the deflection of the mask frame 12 can be corrected.

The number of the correction mechanism the number of the position of the correction mechanism, the number of the alignment position and alignment position is merely an example, and various modifications are possible as long as the deflection of the mask frame 12 can be corrected.

The vapor deposition method according to the present invention can be applied to a vertical deposition apparatus for depositing a vapor deposition material other than an organic EL material on a substrate. For example, the vapor deposition method according to the present invention can also be applied when depositing a vapor deposition material for an organic diode element, for example Organic Photo Diode (OPD), on a substrate.

It is also within the scope of the present invention that a skill in art adds, deletes, or changes the design of a component, or adds, omits, or changes the conditions of a process as appropriate based on the vapor deposition mask of the above-described embodiment, as long as the gist of the present invention is provided.

Even if it is other working effects which differ from the working effect brought about by the mode of each above-mentioned embodiment, what is clear from the description in this description, or what can be easily predicted by the person skilled in the art is naturally understood to be brought about by the present invention.

What is claimed is:

1. A vapor deposition method for depositing evaporated materials on a substrate using a mask, the vapor deposition method comprising:
    arranging a mask frame facing the substrate so that a first side is higher than a second side in a direction of gravity, the mask frame being provided with a mask and having the first side and the second side facing each other; and
    correcting a deflection of the mask frame in the direction of gravity after the mask frame is placed using a correction mechanism including a first moving member, a second moving member located in contact with the mask frame, and a reduction mechanism moving the second moving member by a second displacement amount smaller than a first displacement amount when the first moving member moves by the first displacement amount.

2. The vapor deposition method according to claim 1, wherein
    correcting the deflection of the mask frame includes applying a force to a position of the mask frame where the deflection occurs.

3. The vapor deposition method according to claim 1, wherein
    correcting the deflection of the mask frame includes applying a force to the center of the first side or the center of the second side.

4. The vapor deposition method according to claim 1, wherein
    correcting the deflection of the mask frame includes applying a force to at least two positions across an axis passing through the center of the first side and the second side.

5. The vapor deposition method according to claim 1, wherein
    the mask frame includes a partition dividing an inner space of the mask frame into a plurality of sections and intersecting the first side and the second side, and
    correcting the deflection of the mask frame includes applying a force to a position where the second side intersects with the partition.

6. The vapor deposition method according to claim 1, wherein correcting the deflection of the mask frame includes applying a force to a position on the first side.

7. The vapor deposition method according to claim 1, wherein
the mask frame includes a partition dividing an inner space of the mask frame into a plurality of sections and intersecting the first side and the second side, and
correcting the deflection of the mask frame includes applying a force to a position other than where the first side intersects with the partition.

8. The vapor deposition method according to claim 1, wherein
at least a part of a sliding surface included in the reduction mechanism is coated to reduce a coefficient of friction of the sliding surface.

9. The vapor deposition method according to claim 1, wherein the reduction mechanism is arranged in a base frame opposite the substrate.

10. The vapor deposition method according to claim 1, wherein
arranging the mask frame opposite the substrate includes aligning a first position in the mask frame with a second position in the substrate and identifying a magnitude of the deflection in the direction of gravity at a third position of the mask frame different from the first position after arranging the mask frame, and
correcting a deflection of the mask frame includes correcting the deflection in the direction of gravity at the third position based on the magnitude of the deflection.

11. The vapor deposition method according to claim 1, wherein
the deposition material is an organic EL material.

* * * * *